(12) United States Patent
Chen et al.

(10) Patent No.: US 10,615,368 B2
(45) Date of Patent: Apr. 7, 2020

(54) ENCAPSULATING FILM STACKS FOR OLED APPLICATIONS WITH DESIRED PROFILE CONTROL

(71) Applicant: Applied Materials, Inc., Santa Clara, CA (US)

(72) Inventors: Jrjyan Jerry Chen, Campbell, CA (US); Soo Young Choi, Fremont, CA (US); Xiangxin Rui, Campbell, CA (US)

(73) Assignee: APPLIED MATERIALS, INC., Santa Clara ( * ) Notice: Subject to any disclaimer, the term of this patent is extended or adjusted under 35 U.S.C. 154(b) by 0 days.

(21) Appl. No.: 15/864,911

(22) Filed: Jan. 8, 2018

(65) Prior Publication Data

US 2018/0198091 A1 Jul. 12, 2018

Related U.S. Application Data

(60) Provisional application No. 62/444,096, filed on Jan. 9, 2017.

(51) Int. Cl.
*H01L 51/52* (2006.01)
*H01L 51/56* (2006.01)
(Continued)

(52) U.S. Cl.
CPC ........ *H01L 51/5253* (2013.01); *C23C 16/042* (2013.01); *C23C 16/308* (2013.01);
(Continued)

(58) Field of Classification Search
CPC ... H01L 51/56; H01L 43/12; H01L 21/32136; H01L 51/5253; H01L 51/5256
See application file for complete search history.

(56) References Cited

U.S. PATENT DOCUMENTS 9,331,311 B2 * 5/2016 Chen ................. H01L 51/56
9,502,686 B2 * 11/2016 Chen ................. H01L 51/5256
(Continued)

FOREIGN PATENT DOCUMENTS

KR 20160020837 A 2/2016
TW 200602515 A 1/2006
(Continued)

OTHER PUBLICATIONS

International Search Report and Written Opinion for PCT/US2018/012756 dated Apr. 30, 2018 (8 pages).
(Continued)

*Primary Examiner* — Jaehwan Oh
(74) *Attorney, Agent, or Firm* — Patterson + Sheridan, LLP (57) ABSTRACT

Embodiments described herein generally relate to a method and apparatus for encapsulating an OLED structure, more particularly, to a TFE structure for an OLED structure with desired profile control of the TFE structure. In one example, a method for forming a thin film encapsulation structure over an OLED structure includes forming a thin film encapsulation structure over an OLED structure disposed on a substrate, and performing a plasma treatment process to the thin film encapsulation structure by supplying a treatment gas mixture including a halogen containing gas to the thin film encapsulation structure.

19 Claims, 6 Drawing Sheets

(51) Int. Cl.

| | | |
|---|---|---|
| *C23C 16/34* | (2006.01) | |
| *C23C 16/30* | (2006.01) | |
| *C23C 16/40* | (2006.01) | |
| *C23C 16/50* | (2006.01) | |
| *C23C 16/56* | (2006.01) | |
| *C23C 16/505* | (2006.01) | |
| *H01L 21/68* | (2006.01) | |
| *H01L 21/677* | (2006.01) | |
| *C23C 16/04* | (2006.01) | |
| *H01L 21/67* | (2006.01) | |

(52) U.S. Cl.
CPC .......... *C23C 16/345* (2013.01); *C23C 16/402* (2013.01); *C23C 16/403* (2013.01); *C23C 16/405* (2013.01); *C23C 16/407* (2013.01); *C23C 16/50* (2013.01); *C23C 16/505* (2013.01); *C23C 16/56* (2013.01); *H01L 21/67742* (2013.01); *H01L 21/681* (2013.01); *H01L 51/56* (2013.01); *H01L 21/67167* (2013.01)

(56) References Cited

U.S. PATENT DOCUMENTS

| | | | |
|---|---|---|---|
| 2003/0181056 A1* | 9/2003 | Kumar | B82Y 25/00 438/710 |
| 2003/0219912 A1* | 11/2003 | Chen | H01L 21/02071 438/3 |
| 2004/0007561 A1* | 1/2004 | Nallan | H01L 21/31122 216/67 |
| 2004/0029393 A1* | 2/2004 | Ying | B82Y 25/00 438/745 |
| 2004/0043526 A1* | 3/2004 | Ying | B82Y 25/00 438/38 |
| 2004/0043620 A1* | 3/2004 | Ying | B82Y 25/00 438/710 |
| 2011/0287580 A1* | 11/2011 | Yamazaki | H01L 27/1225 438/104 |
| 2012/0264305 A1* | 10/2012 | Nakano | H01L 21/0273 438/694 |
| 2014/0024180 A1 | 1/2014 | Choi et al. | |
| 2014/0179040 A1 | 6/2014 | Ramadas et al. | |
| 2014/0256070 A1* | 9/2014 | Chen | C23C 16/401 438/26 |
| 2015/0028295 A1* | 1/2015 | Choi | H01L 51/56 257/40 |

FOREIGN PATENT DOCUMENTS

| | | |
|---|---|---|
| TW | 201236231 A | 9/2012 |
| TW | 201421762 A | 6/2014 |
| TW | 201444140 A | 11/2014 |
| TW | 201701514 A | 1/2017 |

OTHER PUBLICATIONS

Office Action from Taiwan Patent Application No. 107100685 dated Jan. 28, 2019.

* cited by examiner

FIG. 1

(PRIOR ART)

ENCAPSULATING FILM STACKS FOR OLED APPLICATIONS WITH DESIRED PROFILE CONTROL

CROSS-REFERENCE TO RELATED APPLICATIONS

This application claims benefit of U.S. Provisional Application Ser. No. 62/444,096 filed Jan. 9, 2017, which is incorporated by reference in its entirety.

BACKGROUND

Field

Embodiments described herein generally relate to a method and apparatus for manufacturing an encapsulating structure for an organic light emitting diode (OLED) device, more particularly, for manufacturing a thin film encapsulation (TFE) structure with a desired profile control for an OLED structure.

Description of the Related Art

Organic light emitting diode displays (OLED) have gained significant interest recently in display applications in view of their faster response times, larger viewing angles, higher contrast, lighter weight, lower power and amenability to flexible substrates. Generally, a conventional OLED is enabled by using one or more layers of organic materials sandwiched between two electrodes for emitting light. The one or more layers of organic materials include one layer capable of monopolar (hole) transport and another layer for electroluminescence and thus lower the required operating voltage for OLED display.

In addition to organic materials used in OLED, many polymer materials are also developed for small molecule, flexible organic light emitting diode (FOLED) and polymer light emitting diode (PLED) displays. Many of these organic and polymer materials are flexible for the fabrication of complex, multi-layer devices on a range of substrates, making them ideal for various transparent multi-color display applications, such as thin flat panel display (FPD), electrically pumped organic laser, and organic optical amplifier.

Figure 1:
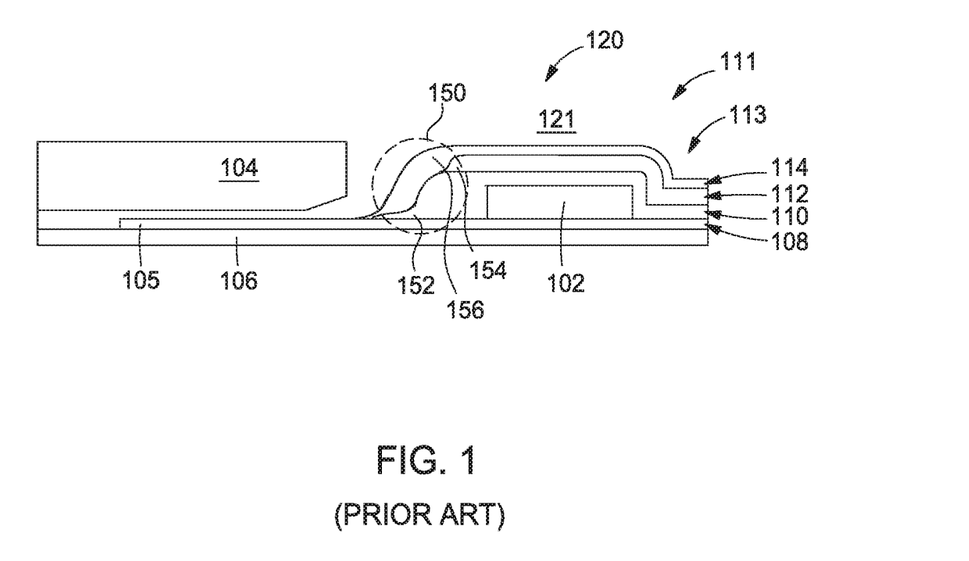
FIG. 1 depicts a schematic cross sectional view of a conventional OLED structure encapsulated by a TFE structure with tail residuals.

Current OLED manufacturing requires evaporation of organic materials and deposition of metals and dielectric materials on a substrate utilizing a plurality of patterned shadow masks. After a series of deposition and etching processes to manufacture the OLED structures, some deposition residuals are often found on the substrate underneath the areas where the patterned shadow masks are located. For example, FIG. 1 depicts a conventional OLED device 120. The conventional OLED device 120 includes a conventional OLED structure 102 having a film stack 111 formed on a substrate 106. A contact layer 108 may be disposed between the substrate 106 and the OLED structure 102. The film stack 111 may include a TFE structure 113 formed on the OLED structure 102. The TFE structure 113 may include a first material layer 110 disposed on the OLED structure 102, a buffer layer 112 disposed on the first material layer 110 and a second material layer 114 disposed on the buffer layer 112. During the manufacturing process, a patterned shadow mask 104 is aligned over the substrate 106 such that the OLED structure 102 is exposed through an opening 121 unprotected by the mask 104, as shown in FIG. 1. The patterned shadow mask 104 is positioned such that a portion 105 of the contact layer 108 is covered by the patterned shadow mask 104 so that any subsequently deposited materials, when manufacturing the TFE structure 113, does not deposit on the portion 105.

However, on some occasions, some portion (e.g., tip ends) 152, 154, 156 of the first material layer 110, the buffer layer 112 and the second material layer 114 from the TFE structure 113 may be extended and grow underneath the patterned shadow mask 104, resulting in a tail residual 150, as indicated by the circle, undesirably found on the substrate 106. The tail residual 150 may alter the profile desired to be formed for the TFE structure 113, adversely affecting the electrical performance and passivation capability of the resultant OLED device 120, thus eventually leading to device failure.

Furthermore, the irregular film contour may also result in the integration difficulty when a wiring and/or bonding process is required to integrate or cast the metal structures of the OLED device 120. The loose bonding nature of the tail residual 150 may also create voids or defects to the TFE structure 113, thus undesirably allowing the moisture or air to sneak into the device structure 120, thereby deteriorating the device electrical performance.

Therefore, an improved method and apparatus for forming encapsulating structure for an OLED device is needed with minimum tail residuals.

SUMMARY

Embodiments described herein generally relate to a method and apparatus for encapsulating an OLED structure, more particularly, to a TFE structure for an OLED structure with desired profile control of the TFE structure. In one example, a method for forming a thin film encapsulation structure over an OLED structure includes forming a thin film encapsulation structure over an OLED structure disposed on a substrate, and performing a plasma treatment process to the thin film encapsulation structure by supplying a treatment gas mixture including a halogen containing gas to the thin film encapsulation structure.

In another embodiment, a method for manufacturing OLED devices on a substrate includes forming a material layer on a substrate to form a thin film encapsulation structure over an OLED structure disposed on the substrate in a processing chamber, and performing a plasma treatment process on the material layer for removing a tail structure in the material layer, wherein the plasma treatment process is performed by supplying a treatment gas mixture including at least a halogen containing gas.

In yet another embodiment, a method for manufacturing OLED devices on a substrate includes performing a plasma treatment process on a thin film encapsulation structure over an OLED structure for removing a tail structure in the thin film encapsulation structure, wherein the plasma treatment process is performed by supplying a treatment gas mixture including at least a halogen containing gas to the thin film encapsulation structure.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to a method and apparatus for encapsulating an OLED structure, more particularly, for manufacturing a TFE structure for encapsulating an OLED structure with desired profile control. The TFE structure includes at least a buffer layer disposed between inorganic materials with desired profile control. A plasma process, such as a plasma treatment process, a plasma cleaning process or a plasma residual removal process, may be performed after or during manufacturing of the TFE structure so as to remove tail residuals, if any, that may be found on the substrate. By doing so, contaminants, residuals, deformed profile, voids, or defects may be removed or altered from the TFE structure on the substrate as needed.

Figure 2:
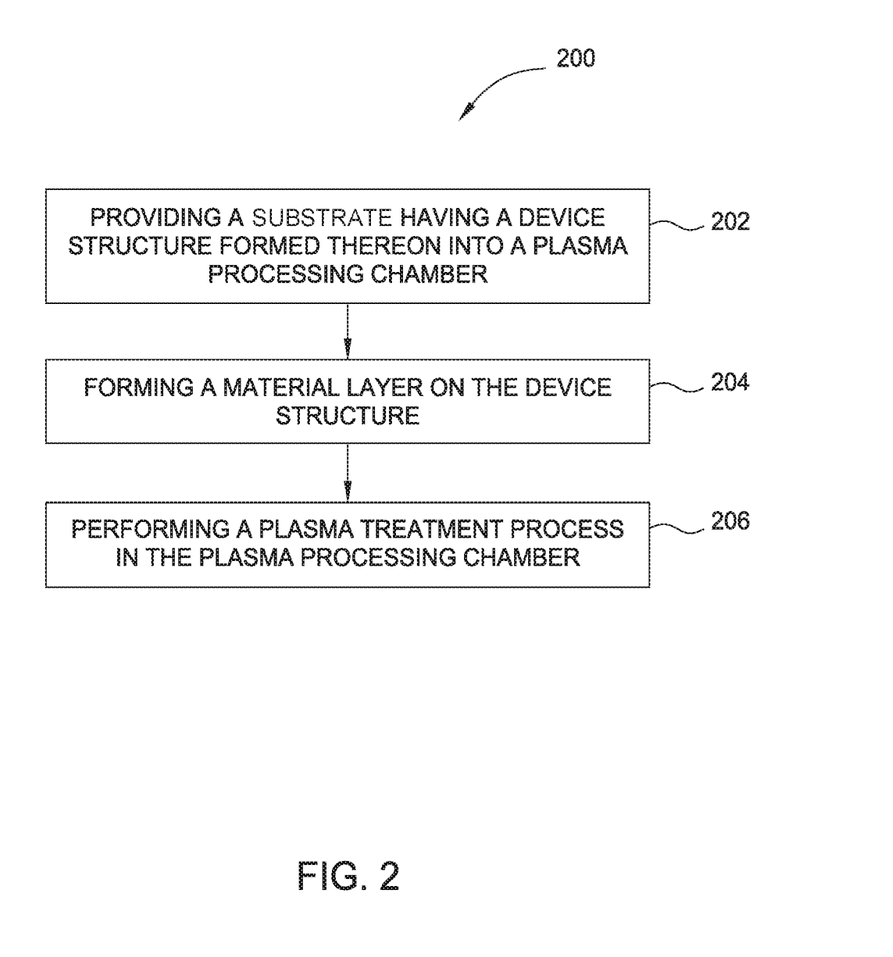
FIG. 2 is a flow diagram of a method for forming the TFE structure over the OLED structure according to various embodiments described herein.

FIG. 2 is a flow diagram of a method 200 for forming an encapsulating structure over the OLED structure with a desired profile control according to various embodiments described herein. FIGS. 3A-3E illustrate schematic cross sectional views of an OLED device 300 during different stages of the method 200 of FIG. 2.

Figure 3A:
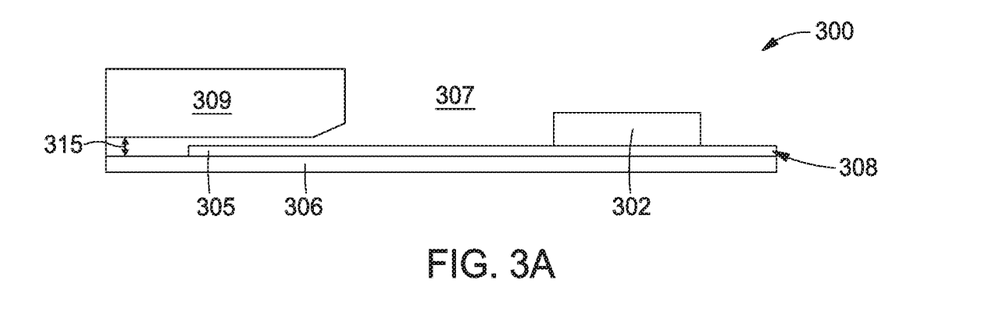
FIGS. 3A-3D illustrate schematic cross sectional views of an OLED device during different stages of the method of FIG. 2.
Figure 4:
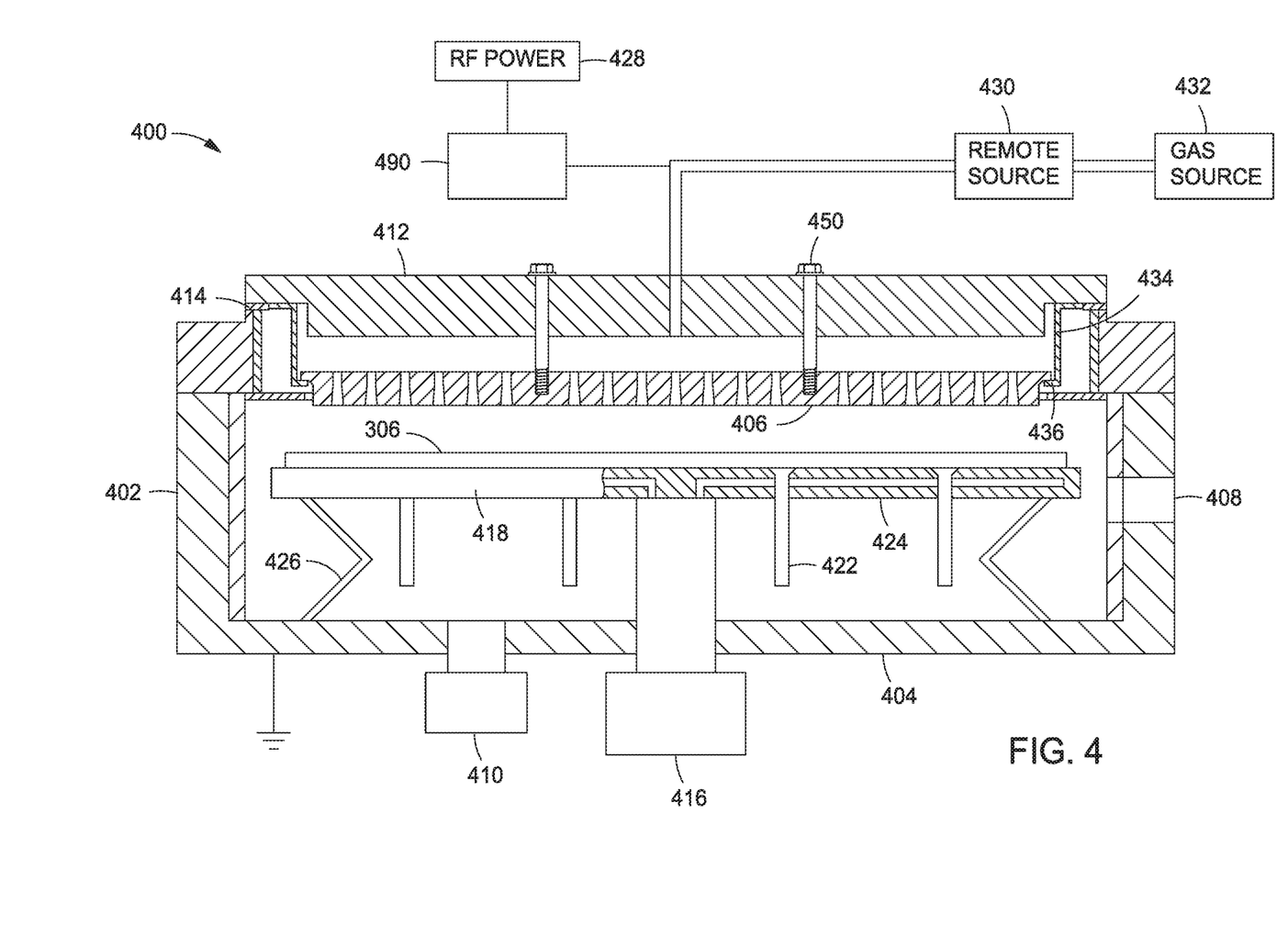
FIG. 4 is a schematic, cross sectional view of a PECVD chamber that may be used to perform the methods described herein.
Figure 5:
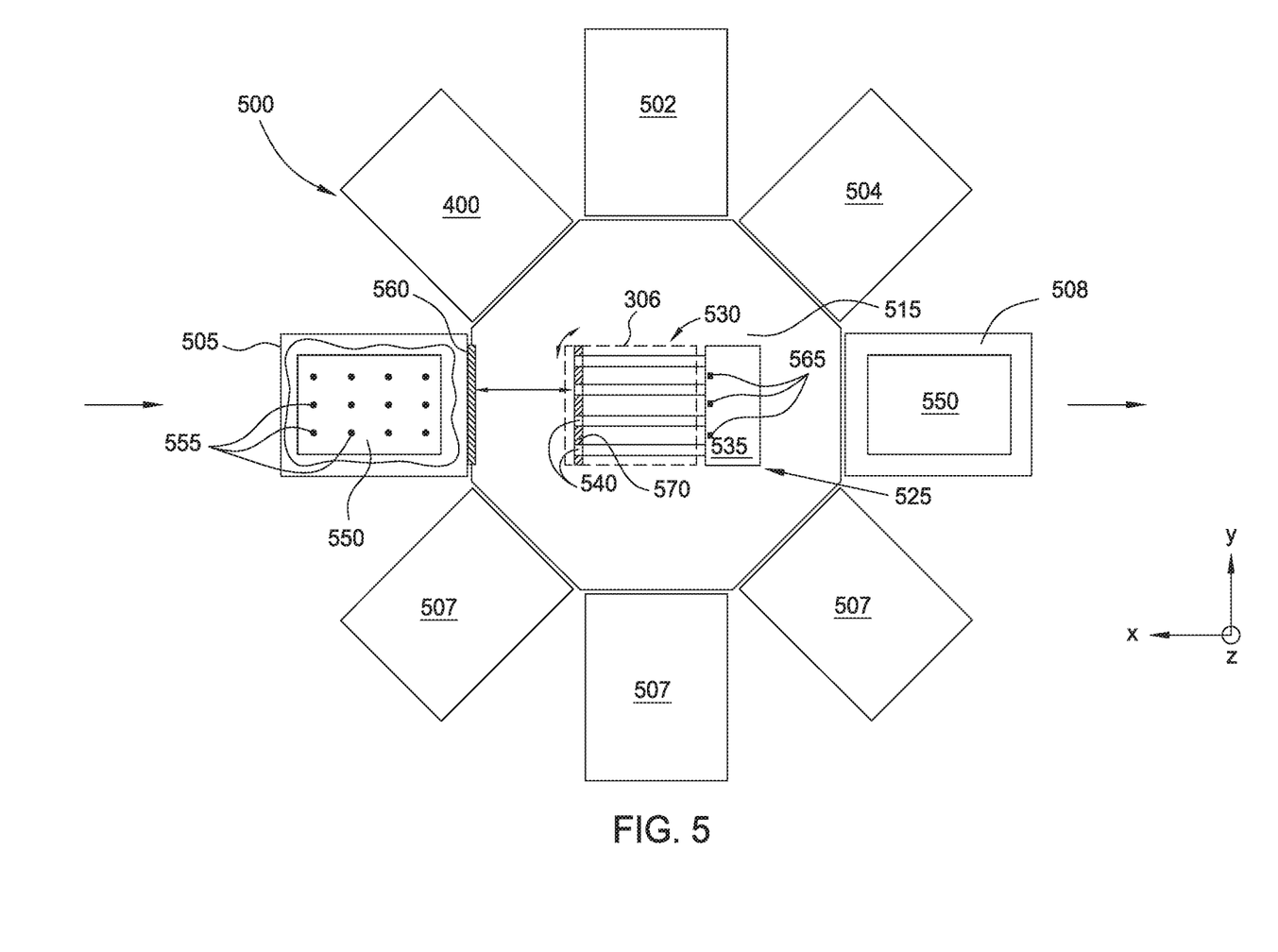
FIG. 5 is a schematic view of a multi-chamber substrate processing system including processing chambers described herein.

The method 200 starts at process 202 by introducing a substrate 306, as depicted in FIG. 3A, having the pre-formed OLED structure 302 disposed thereon into a plasma processing chamber, such as the plasma processing chamber 400 depicted in FIG. 4, disposed in a cluster system, such as the cluster system 500 depicted in FIG. 5, that include multiple plasma processing chamber. The processing chamber 400 and the cluster system 500 will be further described below with reference to FIGS. 4 and 5.

In one embodiment, the substrate 306 has the contact layer 308 disposed thereon, with the OLED structure 302 disposed on the contact layer 308, as shown in FIG. 3A. In one example, the substrate 306 may be made of glass or plastic, such as polyethyleneterephthalate (PET) or polyethyleneterephthalate (PEN). The contact layer 308 may be made of silicon nitride (SiN) and/or silicon oxide ($SiO_2$).

After the substrate 306 is provided in the plasma processing chamber, such as the plasma processing chamber 400 depicted in FIG. 4, a mask 309 is aligned over the substrate 306 having a first predetermined distance 315 spaced apart from and above the substrate 306 such that the OLED structure 302 is exposed through an opening 307 unprotected by the mask 309, as shown in FIG. 3A. The mask 309 is positioned such that a portion 305 (e.g., a tip end) of the contact layer 308, adjacent but distanced away from the OLED structure 302, is covered by the mask 309 so that any subsequently deposited material does not deposit on the portion 305. The portion 305 of the contact layer 308 is the electrical contact for the OLED device 300. The mask 309 may be made from a metal material, such as INVAR®.

Figure 3B:
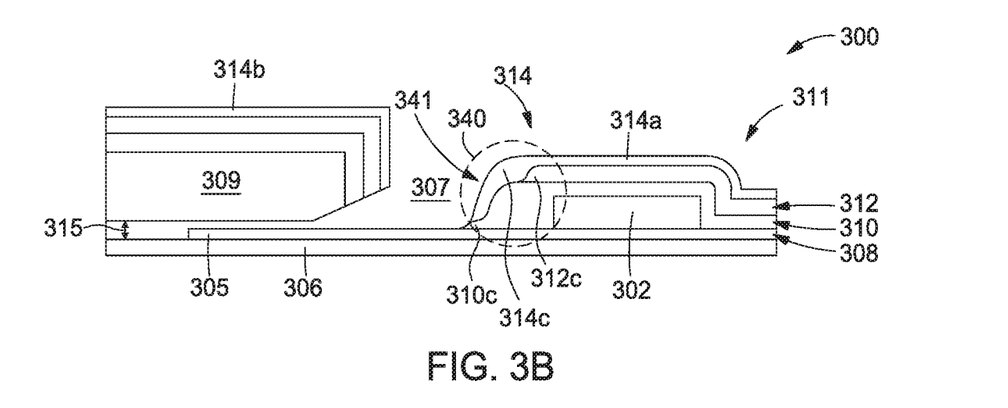

At process 204, after the substrate 306 is provided in the plasma processing chamber, a deposition process may be performed to form a material layer 311 on the substrate 306, which may be utilized to form as a TFE structure. In the example wherein the substrate 306 includes the OLED structure 302 pre-formed thereon, the material layer 311 includes a first inorganic layer 310, a buffer layer 312 and the second inorganic layer 314 formed on the OLED structure 302, as shown in FIG. 3B, in combination forming the TFE structure. The first inorganic layer 310, the buffer layer 312 and the second inorganic layer 314 may be consecutively formed in a single deposition chamber, such as the plasma processing chamber 400 depicted in FIG. 4, without breaking vacuum and removing the substrate 306 from the processing chamber until the material layer 111 is completed and formed on the substrate 306. Alternatively, the first inorganic layer 310, the buffer layer 312 and the second inorganic layer 314 may each formed in different plasma processing chambers but all incorporated in the same cluster system, such as the cluster system 500 depicted in FIG. 5. In such example, the substrate 306 is transferred between different processing chambers incorporated in the cluster system 500 without breaking vacuum so as to maintain a minimum likelihood of contamination and/or moisture resulted from exposure to the atmosphere or environment.

In the example wherein the substrate 306 has the first inorganic layer 310 and the buffer layer 312 pre-formed thereon, the deposition process performed at process 204 may predominately form the second inorganic layer 314 on the substrate 306. It is noted that the material layer 311 may include more or less than the first inorganic layer 310, the buffer layer 312 and the second inorganic layer 314 depicted in FIG. 3B. For example, the material layer 311 may further include interface layers, barrier layers or any suitable adhesion enhancement layers at the interfaces between the first inorganic layer 310 and the buffer layer 312, or between the buffer layer 312 and the second inorganic layer 314 and/or below the first inorganic layer 310 and/or above the second inorganic layer 314, or any places as needed. In the example depicted herein, the deposition process performed at process 204 includes forming the first inorganic layer 310, the buffer layer 312 and the second inorganic layer 314 on the substrate 306.

The first inorganic layer 310 may be a dielectric layer including silicon nitride (SiN), silicon oxynitride (SiON), silicon dioxide ($SiO_2$), aluminum oxide ($Al_2O_3$), aluminum nitride (AlN), titanium oxide ($TiO_2$), zirconium (IV) oxide ($ZrO_2$), aluminum titanium oxide (AlTiO), aluminum zirconium oxide (AlZrO), zinc oxide (ZnO), indium tin oxide (ITO), AlON, combinations thereof or other suitable dielectric layer, formed by a PECVD, an ALD process, or any suitable deposition processes. In one embodiment, the first inorganic layer 310 is a silicon nitride layer. The buffer layer 312 may be an organic layer, such as a hexamethyldisiloxane (HMDSO) layer, for example a fluorinated plasma-polymerized HMDSO (pp-HMDSO:F), formed by a PECVD process. Alternatively, the buffer layer 312 may be a monomer or polymer material composed by hydrocarbon compounds. The monomer or polymer material may have a formula $C_xH_yO_z$, wherein x, y and z are integers. In one particular embodiment, the buffer layer 312 may be selected from a group consisting of polyacrylate, parylene, polyimides, polytetrafluoroethylene, copolymer of fluorinated ethylene propylene, perfluoroalkoxy copolymer resin, copolymer of ethylene and tetrafluoroethylene, parylene or other suitable polymeric materials. In specific example, the buffer layer 312 is polyacrylate or parylene. In one example, the buffer layer 312 may be formed by an inkjet process, a flash evaporator, inkjet, a spin-coating process, spray coating, aerosol coating, or other suitable deposition process as needed. The second inorganic layer 314 may be a dielectric layer similar, the same or identical to the first inorganic layer 310.

In one embodiment, during deposition of the material layer 311, the second inorganic layer 314 has a first portion 314b formed on the mask 309 and a second portion 314a formed on the OLED structure 302. Similarly, the first inorganic layer 310 and the buffer layer 312 have a first portion 310b, 312b formed on the mask 309 and a second portion 310a, 312b formed on the OLED structure 302 respectively. As discussed above, some tail residuals 341 may be found at tip ends 310c, 312c, 314c of the first inorganic layer 310, the buffer layer 312 and the second inorganic layer 314, as indicated by the circle 340 depicted in FIG. 3B, at the region under or adjacent to the mask 309. Such undesired tail residuals 341 may adversely affect the electric performance of the OLED device 300 as well as the pool profile and incapacitating capability to the material layer 311, which is utilized to form as the TFE structure on the OLED structure 302.

At process 206, a plasma treatment process is performed. The plasma treatment process may remove the undesired tail residuals 341 from the substrate 306. The plasma treatment process may also be a plasma etching or plasma ashing process. The plasma treatment process may be performed in the same processing chamber where the deposition is performed to form the material layer 311, such as the plasma processing chamber 400 depicted in FIG. 4. Similarly, the plasma treatment process may be performed in other suitable plasma processing chamber incorporated in the cluster system 500 depicted in FIG. 5 where the plasma processing chamber 400 is also incorporated thereto. Alternatively, the plasma treatment process may be performed in other stand-alone processing chamber not incorporated in the cluster system 500 where the plasma processing chamber 400 is incorporated.

Figure 3C:
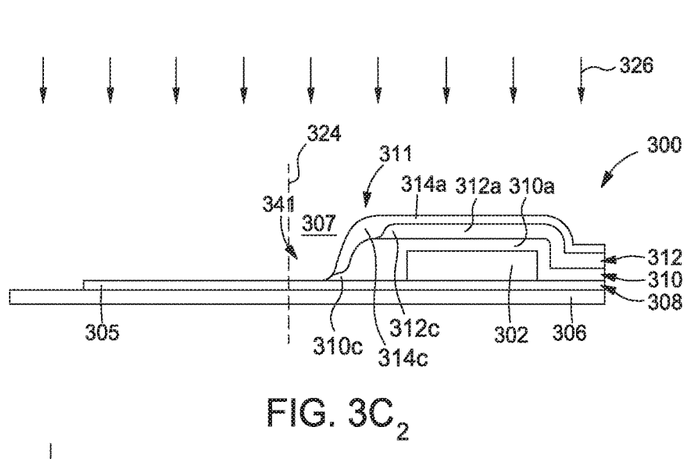
Figure 3C:
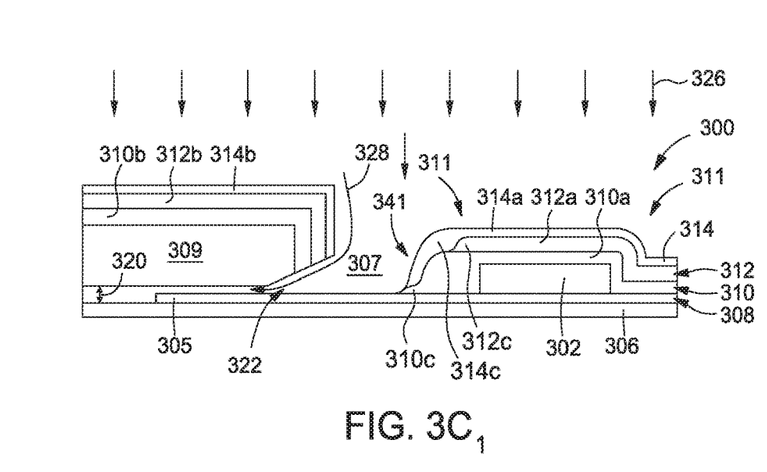

In the example wherein the plasma treatment process is performed in the same processing chamber 400 as the processing chamber where the material layer 311 is formed, the plasma treatment process may be performed with the mask 309 remaining in the processing chamber 400 above the substrate 306. The mask 309 is spaced apart from and above the substrate 306 at a second predetermined distance 320 above the substrate 306, as depicted in FIG. $3C_1$. The second predetermined distance 320 is slightly larger than the first predetermined distance 315, as depicted in FIG. 3B. The second predetermined distance 320 with larger length may allow the plasma 326 from the plasma treatment process to pass through the opening 307, further extending to the area 322 (e.g., distanced away from the OLED structure 302 but close to the mask 309) between the material layer 311 and the mask 309, as indicated by the arrow 328, so as to efficiently remove the tail residuals 341 from the substrate 306. In one example, the second predetermined distance 320 may have a length larger than that of the first predetermined distance 315. The second predetermined distance 320 with larger length may be achieved by adjusting (e.g., enlarging) the spacing of the substrate support 418 where the substrate 306 is positioned on relative to the mask 309.

In another example wherein the plasma treatment process is performed in a separate processing chamber different from the processing chamber 400 where the material layer 311 is formed, the plasma treatment process may be performed without the mask 309 disposed above the substrate, as depicted in FIG. $3C_2$. In such example, the plasma treatment process is performed globally and universally to remove loose bonding structures, including the tail residuals 341, across the substrate 306. Thus, a slight overall thickness reduction may be found in the material layer 311 (as well as the exposed portion 305 of the contact layer 308). As the plasma treatment process is controlled as a gentle surface residual removal process, the overall thickness reduction of the structures on the substrate 306 is minimum and negligible. Thus, after the plasma treatment process at process 206, the tail residuals 341 may be predominately removed to provide a controlled/desired profile, as defined by the axis 324, of the material layer 311, which may be later utilized as the TFE structure for the OLED structure 302.

In one example, the plasma treatment process performed at process 206 may include a remote plasma source process that supplies plasma from a remote source to the processing chamber. The plasma treatment process may include a remote plasma treatment process (or called remote plasma cleaning or remote plasma etching process) performed on the substrate 306 to remove the tail residuals 341, if any, from the substrate 306. The remote plasma treatment process is a gentle residual removal process performed to slowly remove the tail residuals 341 underneath the mask 309 on the substrate 306. The remote plasma treatment process is performed by supplying a treatment gas mixture through the remote plasma source 430 as depicted in FIG. 4 and generating a remote plasma passing through the showerhead 406 to the substrate 306 for processing. In some embodiments wherein a directional plasma source is desired, the treatment gas mixture may be supplied into the processing chamber 400 and then a RF source 428 as depicted in FIG. 4 is then applied to ignite the plasma from the treatment gas mixture to form the plasma in the processing chamber as needed.

Figure 3D:
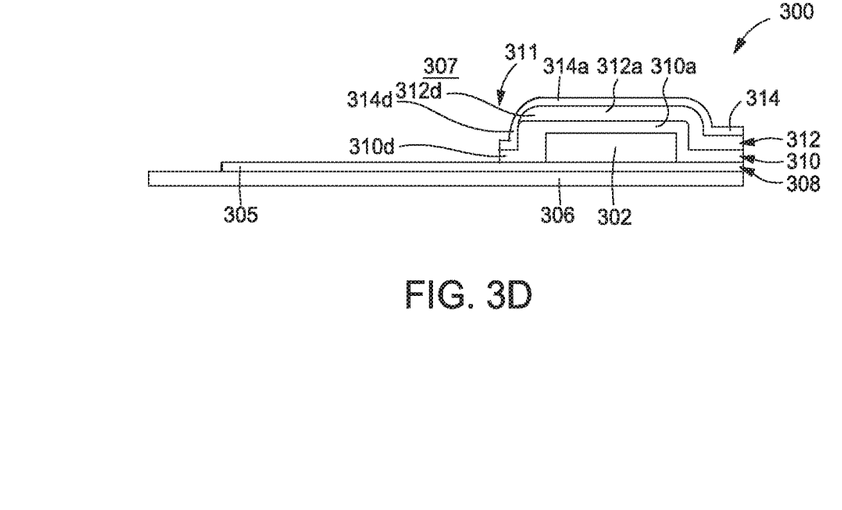

In one example, the treatment gas mixture used to remove the tail residuals 341 includes a halogen containing gas and/or a carrier gas. As the plasma is generated remotely in the remote plasma source 430, the reactive species dissociated from the treatment gas mixture from the remote plasma is relatively mild and gentle, so as to slowly, gently and gradually chemically react the tail residuals 341 until the tail residuals 341 are removed, as shown in FIG. 3D. It is believed that in the remote plasma source, the inert gas supplied in the treatment gas mixture may assist increasing the life of the ions in the plasma formed from the treatment gas mixture. Increased life of the ions may assist reacting with the tail residuals 341 on the substrate 306 more globally, so as to improve removal uniformity across the surface of the substrate 306. After the tail residuals 341 is removed, substantially vertical sidewalls 310d, 312d, 314d may be obtained from the first inorganic layer 310, the buffer layer 312 and the second inorganic layer 314 respectively.

In another embodiment, the plasma treatment process performed at process 206 may also be a directional plasma treatment process, which utilizes a RF source or bias power (with or without the remote plasma source process) applied either to the showerhead assembly or substrate support assembly or both to generate the plasma. The RF source power, bias power or remote plasma source is applied to generate the plasma in the presence of the treatment gas mixture to remove the tail residuals 341.

Suitable examples of the halogen containing gas in the treatment gas mixture include nitrogen trifluoride ($NF_3$), $BCl_3$, $Cl_2$, HCl, HBr, and the like. Suitable examples of the or carrier gas include an inert gas, such as Ar, He or nitrogen or oxygen containing gas, such as $N_2$, $O_2$, $N_2O$, $NO_2$, $NH_3$, NO and the like. In one embodiment, the halogen containing gas is $NF_3$ at a volumetric flow rate of between about 800 sccm and about 2000 sccm over a substrate with a substrate size of 370 mm×470 mm. In one embodiment, the inert or carrier gas is Ar or He at a volumetric flow rate of between about 500 sccm and about 2000 sccm over a substrate with a substrate size of 370 mm×470 mm.

During the plasma treatment process at process 206, several process parameters may be regulated to control the plasma treatment process. In one exemplary embodiment, a process pressure in the processing chamber 100 is regulated to between about 10 mTorr to about 5000 mTorr, such as between about 300 mTorr and about 3000 mTorr. A substrate temperature may be maintained at a range of between about 40 degrees Celsius and about 100 degrees Celsius. The plasma treatment process may be performed for between about 5 seconds and about 600 seconds, such as between about 20 seconds and about 60 seconds.

Furthermore, while performing the treatment process with the remote plasma source, in some examples, a RF source power and/or a RF bias power may be supplied either to the showerhead 406 or the substrate support 418 to perform a RF assisted remote plasma treatment process (e.g., supplying a remote plasma power as well as a RF source power and/or a RF bias power during the plasma treatment process). It is believed that the RF source and/or bias power supplied to one of the electrode, either to the substrate support 418 or the showerhead 406 depicted in FIG. 4 (so called RF assisted RPS process) may assist the removal efficiency as well as provide concentrated ion/plasma density. While applying the RF source and/or bias power to the processing chamber, a gas mixture including an inert gas, such as Ar or He, or an oxygen containing gas, such as $O_2$, $H_2O$, $NO_2$ or $N_2O$, may be supplied to the processing chamber. Thus, by selecting RF source and/or bias power at a desired range, uniform cleaning efficiency may be promoted. In one example, the RF source and/or bias power at a frequency of about 13.5 MHz may be provided at a range between about 10 Watts and about 2000 Watts to the processing chamber with a substrate size of 370 mm×470 mm.

After the remote plasma source process, e.g., the plasma treatment process, the tail residual may be removed from the substrate 306, as shown in FIG. 3D with a desired and controlled profile, structure and dimension.

FIG. 4 is a schematic, cross sectional view of a PECVD chamber 400 that may be used to perform the operations, such as the deposition process at process 204 and the plasma treatment process at process 206 of the method 200 depicted above with reference to FIG. 2. One or more films may be deposited onto the substrate 306 placed inside the PECVD chamber 400. The chamber 400 generally includes chamber walls 402, a bottom 404 and a showerhead 406 which define a process volume. A substrate support 418 is disposed within the process volume. The process volume is accessed through a slit valve opening 408 such that the substrate 306 may be transferred in and out of the chamber 400. The substrate support 418 is coupled to an actuator 416 to raise and lower the substrate support 418. Lift pins 422 are moveably disposed through the substrate support 418 to move the substrate 306 to and from the substrate receiving surface. The substrate support 418 also includes heating and/or cooling elements 424 to maintain the substrate support 418 at a predetermined temperature. The substrate support 418 also includes RF return straps 426 to provide an RF return path at the periphery of the substrate support 418.

The showerhead 406 is coupled to a backing plate 412 by a fastening mechanism 450. The showerhead 406 is coupled to the backing plate 412 by one or more fastening mechanism 450 to help prevent sag and/or control the straightness/curvature of the showerhead 406.

A gas source 432 is coupled to the backing plate 412 to provide gas through gas passages in the showerhead 406 to a processing area between the showerhead 406 and the substrate 420. A vacuum pump 410 is coupled to the chamber 400 to maintain the process volume at a predetermined pressure. An RF source 428 is coupled through a match network 490 to the backing plate 412 and/or to the showerhead 406 to provide an RF current to the showerhead 406. The RF current creates an electric field between the showerhead 406 and the substrate support 418 so that a plasma may be generated from the gases between the showerhead 406 and the substrate support 418.

A remote plasma source 430, such as an inductively coupled remote plasma source 430, is coupled between the gas source 432 and the backing plate 412. Between processing substrates, a cleaning gas may be provided to the remote plasma source 430 so that a remote plasma is generated. The radicals from the remote plasma may be provided to chamber 400 to clean chamber 400 components. The cleaning gas may be further excited by the RF source 428 provided to the showerhead 406.

In the plasma treatment process performed at process 206 depicted above with reference to FIG. 2, the plasma for the remote plasma source process as performed at process 206 may be generated from the remote plasma source 430 then supplied through the showerhead 406 to the substrate 306 for processing, so as to efficiently remove the tail residuals 341, if any, from the substrate 306.

The showerhead 406 is additionally coupled to the backing plate 412 by showerhead suspension 434. In one embodiment, the showerhead suspension 434 is a flexible metal skirt. In one embodiment, the showerhead suspension 434 has a lip 436 upon which the showerhead 406 may rest. The backing plate 412 may rest on an upper surface of a ledge 414 coupled with the chamber walls 402 to seal the chamber 400.

FIG. 5 is a top plan view of a multi-chamber substrate processing cluster system 500 suitable for the fabrication of organic light emitting diodes (OLEDS), thin-film transistors (TFT), and solar cell fabrication on flat media. The cluster system 500 includes a plurality of processing chambers 400, 502, 504, 507 and one or more load lock chambers 505, 508 positioned around a central transfer chamber 515. The processing chambers 400, 502, 504, 507 may be configured to complete a number of different processing steps to achieve a desired processing of flat media, such as a large area substrate 306 (outlined in dashed lines). The load lock chambers 505, 508 are configured to transfer a substrate in a quadrilateral form from an ambient environment outside the cluster system 500 to a vacuum environment inside the transfer chamber 515.

Positioned within the transfer chamber 515 is a transfer robot 525 having an end effector 530. The end effector 530 is configured to be supported and move independently of the transfer robot 525 to transfer the substrate 306. The end effector 530 includes a wrist 535 and a plurality of fingers 540 adapted to support the substrate 306. In one embodiment, the transfer robot 525 is configured to be rotated about a vertical axis and/or linearly driven in a vertical direction (Z direction) while the end effector 530 is configured to move linearly in a horizontal direction (X and/or Y direction) independent of and relative to the transfer robot 525. For example, the transfer robot 525 raises and lowers the end effector 530 (Z direction) to various elevations within the transfer chamber 515 to align the end effector 530 with openings in the processing chambers 400, 502, 504, 507 and the load lock chambers 505, 508. When the transfer robot 525 is at a suitable elevation, the end effector 530 is extended horizontally (X or Y direction) to transfer and/or position the substrate 306 into and out of any one of the processing chambers 400, 502, 504, 507 and the load lock chambers 505, 508. Additionally, the transfer robot 525 may be rotated to align the end effector 530 with other processing chambers 400, 502, 504, 507 and the load lock chambers 505, 508.

In one example, the processing chambers 400, 502, 504, 507 incorporated in the cluster system 500 may be the plasma enhanced chemical vapor deposition (PECVD) chamber 400 depicted in FIG. 4, or other suitable chambers, such as HDP-CVD, PVD, ALD, thermal annealing, surface treatment, electron beam (e-beam) treatment, plasma treatment, etching chambers, ion implantation chambers, surface cleaning chamber, metrology chambers, spin-coating chamber, polymer spinning deposition chamber or any suitable chambers as needed. In one example depicted in the multi-chamber substrate processing cluster system 500, the cluster system 500 includes the chemical vapor deposition (such as a PECVD) chamber 400, the etching processing chamber 502, the plasma treatment chamber 504 and other suitable chambers 507 as needed. By such arrangement, the material layer 311 (including the first inorganic layer 310, the buffer layer 312 and the second inorganic layer 314) formed at process 204 and the plasma treatment process at process 206 may also be integrated to perform in a single chamber and/or in a single cluster system 500 without breaking vacuum so as to maintain cleanliness of the substrate without undesired contamination and residuals from the environment.

A portion of the interior of load lock chamber 505 has been removed to expose a substrate support or susceptor 550 that is adapted to receive and support the large area substrate 306 during processing. The susceptor 550 includes a plurality of lift pins 555 that are movable relative to an upper surface of the susceptor 550 to facilitate transfer of the large area substrate 306. In one example of a transfer process of the large area substrate 306, the lift pins 555 are extended away from or above the upper surface of the susceptor 550. The end effector 530 extends in the X direction into the processing chamber 400, 502, 504, 507 or load lock chambers 505, 508 above the extended lift pins. The transfer robot 525 lowers the end effector 530 in the Z direction until the large area substrate 306 is supported by the lift pins 555. The lift pins 555 are spaced to allow the fingers 540 of the end effector 530 to pass the lift pins 555 without interference. The end effector 530 may be further lowered to assure clearance between the large area substrate 306 and the fingers 540 and the end effector 530 is retracted in the X direction into the transfer chamber 515. The lift pins 555 may be retracted to a position that is substantially flush with the upper surface of the susceptor 550 in order to bring the large area substrate 306 into contact with the susceptor 550 so the susceptor 550 supports the large area substrate 306. A slit valve or door 560 between the transfer chamber 515 and the load lock chamber 505, 508 (or the processing chamber 400, 502, 504, 507) may be sealed and processing may be commenced in the load lock chamber 505, 508 (or the processing chamber 400, 502, 504, 507). To remove the large area substrate 306 after processing, the transfer process may be reversed, wherein the lift pins 555 raise the large area substrate 306 and the end effector 530 may retrieve the large area substrate 306. In one example, the substrate 306 may be transferred into the multi-chamber substrate processing cluster system 500 through the first load lock chamber 505. After the substrate 306 is oriented and aligned to a desired position, the substrate 306 is then transferred to any one of the processing chambers 400, 502, 504, 507 through the transfer chamber 515 to perform any suitable processes as needed to form a device structure on the substrate 306. After the processes are completed in the processing chambers 400, 502, 504, 507, then the substrate 306 is removed from and transferred out of the multi-chamber substrate processing cluster system 500 from the second load lock chamber 508 as needed.

The environment in the multi-chamber substrate processing cluster system 500 is isolated from ambient pressure (i.e. pressure outside the cluster system 500) and is maintained at a negative pressure by one or more vacuum pumps (not shown). During processing, the processing chambers 400, 502, 504, 507 are pumped down to pre-determined pressures configured to facilitate thin film deposition and other processes. Likewise, the transfer chamber 515 is held at a reduced pressure during transfer of the large area substrates to facilitate a minimal pressure gradient between the processing chambers 400, 502, 504, 507 and the transfer chamber 515. In one embodiment, the pressure in the transfer chamber 515 is maintained at a pressure lower than ambient pressure. For example, the pressure in the transfer chamber may be about 7 Torr to about 10 Torr while the pressure in the processing chambers 400, 502, 504, 507 may be lower. In one embodiment, the maintained pressure within the transfer chamber 515 may be substantially equal to the pressure within the processing chambers 400, 502, 504, 507 and/or load lock chambers 505 and 508 to facilitate a substantially equalized pressure in the cluster system 500.

During the transfer of the large area substrate 306 in the transfer chamber 515 and the processing chambers 400, 502, 504, 507, proper alignment of the large area substrate 306 is crucial to prevent collisions and/or damage of the large area substrate 306. Additionally, the interior of the cluster system 500 must be kept clean and free from debris such as broken pieces of a substrate, broken equipment, and other particulate contamination. While some conventional systems include view windows allowing line of sight viewing into the interior of the various chambers 400, 502, 504, 507, the windows may not allow a full view and/or precise inspection of the large area substrates and the interior of the various chambers 400, 502, 504, 507. Also, the conventional systems are not configured to view the large area substrate 306 and provide a metric of processing results while the large area substrates are in the system.

The transfer robot 525 includes one or more optical image sensors 565 and 570 disposed on the transfer robot 525 as needed. The one or more optical image sensors 565, 570 may be optical scanners, imagers or cameras, such as a charged-coupled device (CCD), a complimentary metal oxide semiconductor (CMOS) device, a video camera, and the like. In one embodiment, one or more of the optical image sensors 565, 570 are mounted on the transfer robot 525 in a position to view the large area substrate 306, the fingers 540 and any object in the line of sight view of the image sensors 565, 570. In this embodiment, the image sensors 565, 570 may be oriented to view objects substantially in the X and Y direction as well as the Z direction as the transfer robot 525 is stationary or moving in the cluster system 500. The image sensors 565, 570 may include wide angle optics, such as a fisheye lens, to enable a greater field of view.

In summary, an OLED structure encapsulated by a TFE structure with a desired process is provided herein. The TFE structure with the desired profile control may be obtained by performing a plasma treatment process after a material layer is formed on an OLED structure. The resultant material layer may be layer utilized to form the TFE structure. The plasma treatment process as performed may remove tail residuals, if any, from the substrate so as to form the TFE structure with desired profile and clean surface. The plasma treatment process may include a remote plasma source process and optionally with a RF power assist process to remove/clean the tail residuals.

While the foregoing is directed to embodiments of the present disclosure, other and further embodiments of the disclosure may be devised without departing from the basic scope thereof, and the scope thereof is determined by the claims that follow.

The invention claimed is:

1. A method for forming a thin film encapsulation structure over an OLED structure, comprising:
    forming a thin film encapsulation structure over an OLED structure disposed on a substrate, wherein the thin film encapsulation structure comprises a first material and a second material different from the first material formed over the OLED structure; and
    performing a plasma treatment process to a top surface of the thin film encapsulation structure by supplying a treatment gas mixture including a halogen containing gas to the thin film encapsulation structure, wherein the plasma treatment process comprises a plasma generated from a remote plasma source.

2. The method of claim 1, wherein the halogen containing gas is selected from a group consisting of nitrogen trifluoride ($NF_3$), $BCl_3$, $Cl_2$, HCl and HBr.

3. The method of claim 1, wherein the treatment gas mixture further comprises a carrier gas.

4. The method of claim 3, wherein the carrier gas is an inert gas, a nitrogen containing gas or an oxygen containing gas.

5. The method of claim 1, wherein the thin film encapsulation structure includes a first inorganic layer, a buffer layer and a second inorganic layer disposed on the buffer layer.

6. The method of claim 5, wherein the first inorganic layer is in a single layer form or in multiple layer form fabricated from at least one material selected from a group consisting of silicon nitride (SiN), silicon oxynitride (SiON), silicon dioxide ($SiO_2$), aluminum oxide ($Al_2O_3$), aluminum nitride (AlN), titanium oxide ($TiO_2$), zirconium (IV) oxide ($ZrO_2$), aluminum titanium oxide (AlTiO), aluminum zirconium oxide (AlZrO), zinc oxide (ZnO), indium tin oxide (ITO), AlON, combinations thereof.

7. The method of claim 1, wherein the thin film encapsulation structure includes tail residuals formed therein.

8. The method of claim 7, wherein the tail residuals are formed at an area distanced from the OLED structure.

9. The method of claim 7, wherein the tail residuals are formed adjacent to a tip end of a contact layer disposed between the OLED structure and the substrate.

10. The method of claim 7, wherein the tail residuals comprise silicon oxide, silicon nitride and/or silicon oxynitride.

11. The method of claim 1, wherein the remote plasma source is generated from a plasma source generated remotely from a plasma processing chamber wherein the plasma treatment process is performed.

12. The method of claim 11, further comprising:
    applying a RF source power to the processing chamber while generating the remote plasma source.

13. The method of claim 12, wherein the plasma treatment process is performed in the same processing chamber or different processing chambers from where the thin film encapsulation structure is formed on the substrate.

14. The method of claim 1, wherein the treatment gas mixture comprises $NF_3$ and Ar.

15. A method for manufacturing OLED devices on a substrate, comprising:
    forming a film stack comprising a first material and a second material different from the first material on the substrate to form a thin film encapsulation structure over an OLED structure disposed on the substrate in a processing chamber; and
    performing a plasma treatment process on the thin film encapsulation structure for removing a tail structure in the film stack, wherein the plasma treatment process is performed by supplying a treatment gas mixture including at least a halogen containing gas, wherein the plasma treatment process comprises a plasma generated from a remote plasma source.

16. The method of claim 15, wherein forming the film stack on the substrate creates tail residuals on the substrate.

17. The method of claim 16, wherein the film stack includes a first inorganic layer, a buffer layer and a second inorganic layer disposed on the buffer layer.

18. The method of claim 15, wherein the film stack is in a single layer form or in multiple layer form fabricated from at least one material selected from a group consisting of silicon nitride (SiN), silicon oxynitride (SiON), silicon dioxide ($SiO_2$), aluminum oxide ($Al_2O_3$), aluminum nitride (AlN), titanium oxide ($TiO_2$), zirconium (IV) oxide ($ZrO_2$), aluminum titanium oxide (AlTiO), aluminum zirconium oxide (AlZrO), zinc oxide (ZnO), indium tin oxide (ITO), AlON, combinations thereof.

19. A method for manufacturing OLED devices on a substrate, comprising:
    performing a plasma treatment process on a thin film encapsulation structure over an OLED structure for removing a tail structure in the thin film encapsulation structure, wherein the thin film encapsulation structure comprises a first material and a second material different from the first material, wherein the plasma treatment process is performed by supplying a treatment gas mixture including at least a halogen containing gas to the thin film encapsulation structure, wherein the plasma treatment process comprises a plasma generated from a remote plasma source.

* * * * *